United States Patent
Adragna

(10) Patent No.: US 10,243,470 B2
(45) Date of Patent: *Mar. 26, 2019

(54) POWER CONTROL MODULE FOR AN ELECTRONIC CONVERTER, RELATED INTEGRATED CIRCUIT, ELECTRONIC CONVERTER AND METHOD

(71) Applicant: STMicroelectronics S.r.l., Agrate Brianza (IT)

(72) Inventor: Claudio Adragna, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/915,758

(22) Filed: Mar. 8, 2018

(65) Prior Publication Data

US 2018/0205317 A1  Jul. 19, 2018

Related U.S. Application Data

(63) Continuation of application No. 15/166,704, filed on May 27, 2016, now Pat. No. 9,948,190.

(30) Foreign Application Priority Data

Dec. 21, 2015 (IT) .................. 102015000086030

(51) Int. Cl.
| | | |
|---|---|---|
| *H02M 3/335* | (2006.01) | |
| *H02M 3/157* | (2006.01) | |
| *H02M 1/08* | (2006.01) | |
| *H03F 3/45* | (2006.01) | |

(Continued)

(52) U.S. Cl.
CPC ......... *H02M 3/33507* (2013.01); *H02M 1/08* (2013.01); *H02M 3/335* (2013.01);
(Continued)

(58) Field of Classification Search
CPC ............ H02M 2001/0003; H02M 2001/0012; H02M 3/335; H02M 3/33515;
(Continued)

(56) References Cited

U.S. PATENT DOCUMENTS

| | | |
|---|---|---|
| 4,914,539 A | 4/1990 | Turner et al. |
| 5,847,942 A | 12/1998 | Bazinet et al. |

(Continued)

FOREIGN PATENT DOCUMENTS

| | | |
|---|---|---|
| CN | 102497711 A | 6/2012 |
| CN | 202997942 U | 6/2013 |

(Continued)

OTHER PUBLICATIONS

Gouttenegre et al., "Modelling and Analysis of DC-DC Converters Control by Power Equalization," 19th Annual IEEE Power Electronics Specialists Conference, Kyoto, Japan, Apr. 11-14, 1988, vol. 2, pp. 960-967.

(Continued)

*Primary Examiner* — Gary L Laxron
(74) *Attorney, Agent, or Firm* — Seed IP Law Group LLP

(57) ABSTRACT

A control circuit for an electronic converter having a power stage controls the operation of a power stage as a function of a feedback control signal that indicates an input power provided to the power stage. The control circuit generates a digital reference signal as a function of the feedback control signal and a first signal based on an input voltage supplied to the power stage. The control circuit generates a modified control signal as a function of the digital reference signal and a second signal based on an input current supplied to the power stage.

20 Claims, 7 Drawing Sheets

(51) Int. Cl.
*H03K 17/687* (2006.01)
*H02M 7/523* (2006.01)
*H02M 1/00* (2006.01)

(52) U.S. Cl.
CPC ....... *H03F 3/45475* (2013.01); *H03K 17/687* (2013.01); *H02M 2001/0009* (2013.01); *H02M 2001/0025* (2013.01); *H02M 2001/0035* (2013.01); *Y02B 70/16* (2013.01)

(58) Field of Classification Search
CPC ..... H02M 3/33523; H02M 2001/0016; H02M 2001/0022; H02M 2001/0025; H02M 3/33569; H02M 2007/4815; H02M 3/157
See application file for complete search history.

(56) References Cited

U.S. PATENT DOCUMENTS

| | | | |
|---|---|---|---|
| 7,239,120 B2 | 7/2007 | Adragna et al. | |
| 7,447,601 B2 | 11/2008 | Lhermite et al. | |
| 7,885,085 B2 | 2/2011 | Orr et al. | |
| 9,112,425 B2 | 8/2015 | Prescott et al. | |
| 9,948,190 B2* | 4/2018 | Adragna | H02M 3/335 |
| 2012/0032661 A1 | 2/2012 | Nakamura | |
| 2013/0026834 A1 | 1/2013 | Matsuoka et al. | |
| 2014/0043866 A1 | 2/2014 | Zhao et al. | |
| 2017/0117812 A1* | 4/2017 | Furtner | H02M 3/33515 |

FOREIGN PATENT DOCUMENTS

| | | |
|---|---|---|
| EP | 2 919 374 A1 | 9/2015 |
| FR | 2996700 A1 | 4/2014 |

OTHER PUBLICATIONS

Kislovski, "A New Control Principle for Switching Regulators," Official Combined Proceedings of the 7th International PCI and the 5th International Motor-Con Conference, Geneva, Switzerland, Sep. 13-15, 1983, pp. 175-186.

* cited by examiner

POWER CONTROL MODULE FOR AN ELECTRONIC CONVERTER, RELATED INTEGRATED CIRCUIT, ELECTRONIC CONVERTER AND METHOD

BACKGROUND

Technical Field

Embodiments of the present disclosure relate to techniques for controlling an electronic converter, such as switched mode power supplies.

Description of the Related Art

Power converters are electronic circuits that transform electrical energy from one form to another and are able to control its flow from a source to a load. Whichever type of power converter one can consider (there are ac-dc, dc-dc, ac-ac and dc-ac power converters, depending on the input and the output), the concept of control is inherent in their nature.

The block diagram of FIG. 1 shows a general structure of a power converter 20, located between a power source 10, such as a battery or the mains, and a load 30.

In the example considered, the power converter 20 includes a power stage 22, sometimes termed "power circuit", and a control unit 24, which is connected to the power stage 22 and controls the power stage 22 operation based on measurements of a number of electrical quantities.

Accordingly, the power converter 20 receives power from the source 10 and converts the electrical energy to a different form to apply to the load 30.

The power stage 22 can be implemented by many circuit topologies, which often include a combination of power semiconductor devices and passive components, mainly transformers, inductors, and/or capacitors. In some converters, the power stage 22 may involve multiple conversion stages using the same or different topologies connected either in a cascade or in parallel.

The control unit 24 receives the measured electrical quantities through one or more sensors S1 and S2 which monitor the operation conditions of the power stage. For example, in FIG. 1 is shown a first group of sensors S1 coupled to the input lines of the power stage 22 and a second group of sensors S2 coupled to the output lines of the power stage 22. For example, the sensors S2 may monitor the output voltage $V_{out}$ and/or the output current $I_{out}$, and the sensors S1 may monitor the input voltage $V_{in}$ and/or input current $I_{in}$. However, in general, also other quantities, both electrical and thermal, may be taken into consideration. Based on the measured quantities received, the control unit 24 outputs control signals that enable the power stage 22 to modulate and control the energy flow, effectively regulating the desired electrical quantities.

Modern power conversion is often based on switched-mode technology, where one or more electronic switches are used to close or open branches in the power circuit 22 at a switching frequency, $f_{SW}$, to control energy flow. The switches are often power semiconductor switches driven by a control unit, i.e., the control quantities output by the control unit are binary (two-level) pulsed signals that determine the open and closed state of the controllable power switches. The power switches may be any suitable semiconductor device for handling high-power switching operations, such as bipolar junction transistors (BJTs), field effect transistors (FETs), and/or insulated gate bipolar transistors (IGBTs). The switches can also include diodes.

For example, for dc-dc converters, the control unit 24 is configured to keep the dc output voltage $V_{out}$ and/or the dc output current $I_{out}$ constant, even under changing operating conditions. Those of skill in the art will appreciate that an ac input power may be converted in a dc input power, e.g., by means of a rectifier, such as a bridge rectifier.

For example, operating conditions may change as a result of changes in the dc input voltage $V_{in}$ or changes in the power demanded by the load 30. The control unit 24 ensures that the output quantity to be regulated ($V_{out}$ or $I_{out}$) is as close as possible to a preset constant value, also referred to as the setpoint.

FIG. 2 illustrates a control unit 24 having a common closed-loop, negative-feedback control design. The control unit of FIG. 2 includes four major blocks: a sensing circuit 240, an optional signal conditioning circuit 242, a modulator 244 and a driver 246.

The sensing circuit 240 measures the quantity $X_{out}$ to be regulated, e.g., either the output voltage $V_{out}$ or the output current $I_{out}$, and produces a measured value signal x being representative of $X_{out}$. Optionally, the sensing circuit 240 may sense other electrical quantities in the power circuit 22 that are used to perform the control action. The measured value signal x is then transmitted to the optional signal conditioning circuit 242.

The signal conditioning circuit 242 processes the measured value signal x coming from the sensing circuit 240. In particular, the signal conditioning circuit 242 receives the measured value signal x and generates a control signal y, such as a control voltage $v_C$ or a control current $i_C$, based on the measured value signal x. Whether the control signal y is a control voltage $v_C$ or a control current $i_C$ is unrelated to whether the quantity $X_{out}$ to be regulated is the output voltage $V_{out}$ or the output current $I_{out}$.

For example, the signal conditioning circuit 242 may include a frequency-compensated error amplifier, such as an I (integral), PI (proportional-integral) or PID (proportional-integral-derivative) regulator. Typically such a regulator is implemented with an operational amplifier (op-amp) surrounded by a passive network that also defines its frequency response in the frequency range that is significant for the control loop (up to about $f_{SW}/2$).

The modulator 244 receives the control signal y and possible other signals directly provided by the sensing circuit 240, properly conditioned if necessary. Specifically, the modulator 244 modulates a quantity $\Psi$, which the power stage ultimately uses to control the energy flow. In the context of switched mode power stages, the modulator 244 outputs a train of low-power two-level pulsed signals $q_j(t)$ that are received by the driver 246.

For example, the driver 246 may be a power amplifier and/or a level shifter that receives the low-power inputs $q_j(t)$ and produces the higher power signals $Q_j(t)$. The signals $Q_j(t)$ have an amplitude and a power level suitable to drive the power switches of the power stage 22.

When the operating conditions of the converter 20 change, any deviation in the regulated quantity $X_{out}$ from the setpoint produces a change in x and, then, in the control signal y. This change in y results in a change in the quantity $\Psi$ handled by the modulator 244, and this change tends to balance the input-to-output energy flow. This balance ensures that the regulated quantity $X_{out}$ remains as close as possible to the setpoint.

In order to achieve an appropriate control of the output quantity $X_{out}$, the control system 24 should be designed to ensure a stable control loop, good regulation, and good dynamic performance. A stable control loop will let the regulated quantity $X_{out}$ recover a steady-state value after the change in the operating conditions. Good regulation is met when the steady-state values of the regulated quantity $X_{out}$ before and after the change are as close to the setpoint as possible. Finally, good dynamic performance is achieved when the regulated quantity $X_{out}$ does not excessively deviate from the setpoint during the transient and the transient itself fades away in a short time.

These control objectives may be expressed in terms of characteristic quantities of the transfer function of the control loop, such as bandwidth, phase margin and dc gain. The objectives can be achieved by acting on the frequency response of the error amplifier network in the signal conditioning circuit 242, such as setting its gain and appropriately placing the poles and zeroes of its transfer function. This may be achieved by selection of the value of resistors and capacitors that make up the passive network attached to the amplifier.

The structure of the modulator 244 or, in other words, the nature of the quantity $\Psi$ it handles, determines the method for controlling the regulation of the output quantity $X_{out}$. There are many of them. One group of methods is based on pulse-width modulation (PWM), and includes methods such as "duty cycle control," (aka "voltage mode control") "peak current-mode control," and "average current-mode control", to name the most popular ones. With the duty cycle control method the quantity $\Psi$ is the ratio between the time $T_{ON}$ during which a power switch is closed to the switching period $T_{SW}=1/f_{SW}$. With the peak current-mode control method the quantity $\Psi$ is the peak current flowing through the energy storage magnetic device. With the average current-mode control method the quantity $\Psi$ is the average current flowing through the energy storage magnetic device. With these methods the switching frequency $f_{SW}$ is usually fixed but not necessarily.

In addition to PWM control methods there are also pulse frequency modulation (PFM) methods, where the switching frequency $f_{SW}$ is variable by definition. Among the many existing methods we can mention the "direct frequency control" method, where $\Psi$ is the switching frequency of the converter; and the "time-shift control" method, where $\Psi$ is the amount of time from a zero-crossing of the current in the energy storage magnetic device to the next change of state of the power switches.

Another important characteristic of the power circuit that impacts on how the control circuit is implemented, in particular the way the control signal y is passed on to the modulator, is whether the converter is isolated or non-isolated. This "isolation" refers to the existence of an electrical barrier between the input and output of the converter 20.

For example, FIG. 3a shows a boost converter. Generally, a boost converter comprises two input terminals for receiving an input voltage $V_{in}$ and two output terminals for providing an output voltage $V_{out}$. A boost converter is a non-isolated converter, because it has a common ground terminal GND for both the input and the output.

As well known to those skilled in the art, the positive input terminal is connected to the positive output terminal via an inductor L and an electronic switch D1, usually in the form of a diode. A further electronic switch SW1 is connected between the intermediate point between the inductor L and the diode D1, and ground GND. Finally, a capacitor $C_{out}$ is usually connected in parallel with the output. The electrical connection between the input and output make non-isolated converters simple and cost efficient, but limits their usage to certain applications, such as Point-Of-Load (POL) converters.

In the example considered, a control unit 24 is used to drive the switch SW1 as a function of the output voltage $V_{out}$. Such non-isolated converters do not need any special electrical provision to provide the control signal to the modulator. If the circuits are properly combined, the output of the signal conditioning circuit can be connected directly to the modulator input.

However, especially for power converters running from the mains, many safety agency bodies or customers require a separation from the applied input voltage and the output voltage, which is often user accessible.

FIG. 3b shows in this respect that such an isolation barrier of converter may be crossed by means of a (high frequency) transformer T, which removes the direct electrical connection from the input to the output.

For example, the circuit shown in FIG. 3b is based on the flyback topology. In this case, the converter comprises at the primary side of the transformer T an electronic switch SW2, which is connected with the primary winding of the transformer T in series between the input terminals. On the secondary side, the converter comprises a flyback diode D2, which is connected with the secondary winding of the transformer T in series between the output terminals. Also in this case, an output capacitor $C_{out}$ may be connected in parallel with the output.

Also in this case, a control unit 24 may be used to drive the switch SW2 as a function of the output voltage $V_{out}$. Accordingly, with such isolated converters, the power is switched on the input side (commonly referred to as the primary side), but under control from the output side (commonly referred to as the secondary side) in order to provide proper regulation. This requirement introduces an additional problem, namely that signals from the secondary side are transmitted to the primary side. The requirement for primary side switching to be controlled by secondary side characteristics requires a second connection crossing the isolation barrier.

The signal to be fed back to the primary side depends on where the modulator 244 and the driver 246 are physically located. Most commonly, both the modulator 244 and the driver 246 are located on the primary side (typically, both embedded in a control integrated circuit or IC). In this case, the control signal y is fed back to the primary side. This case is commonly referred to as "primary control".

In other implementations all the parts of the control unit except the driver 246 are located on the secondary side (again, typically embedded in a control IC). In this case, commonly referred to as "secondary control", the two-level pulsed signals $q_j(t)$ or $Q_j(t)$ are fed back to the primary side. No matter what signal is transferred back and although this path involves only information, rather than power, it should still be isolated.

For example, FIG. 4 shows a common solution of a signal conditioning circuit 242 configured to feed the control signal y back to the primary side in case the output quantity to be regulated is $V_{out}$ (i.e., $X_{out}=V_{out}$).

In this arrangement a three-pin adjustable shunt regulator SR, such as a TL431, is used as secondary reference/error amplifier that drives an optocoupler OC. Basically, the shunt regulator SR is configured to sense the output voltage $V_{out}$, e.g., by means of a voltage sensor $S2_a$ comprising a voltage divider consisting in two resistors R1 and R2, and produces a control signal based on the difference between the setpoint and the actual value, while the optocoupler OC transfers the control signal to the primary side. Those of skill in the art will appreciate that the signal conditioning circuit 242 may also comprise a compensation network CN comprising, e.g., one or more capacitors and/or resistors.

Specifically, in the example considered, the photodiode of the optocoupler OC is connected with a resistor R3 and the shunt regulator SR in series between the output terminals, i.e., $V_{out}$. Accordingly, with this circuit arrangement, output voltage changes $\Delta V_{out}$ cause corresponding changes $\Delta i_{cp}$ in the current $i_{cp}$ flowing through the resistor R3 and the photodiode of the optocoupler OC. The current change $\Delta i_{cp}$ determines a proportional change $\Delta i_c$ in the current $i_c$ drawn by the phototransistor of the optocoupler OC. This current may be used to drive the modulator 244 directly (in this case $y=i_c$), or may be first converted into a voltage before being fed into the modulator ($y=v_c$). For example, in FIG. 4 is shown a resistor $R_{FB}$, which is connected for this purpose between the output of the optocoupler OC, i.e., the feedback pin of the modulator 244 and a constant voltage indicated with $V_{bus}$.

It is a common market requirement in many power converters to specify conversion efficiency targets over a wide range of power levels demanded by the load. To meet this goal it is necessary to take some control actions in response to this power level.

Typical examples of these actions include modifying some control parameters (e.g., the switching frequency), or changing the events determining the turn on and off of the power switch(s) (e.g., switches SW1 and SW2 shown in FIGS. 3a and 3b) or operating the converter intermittently (commonly referred to as burst-mode operation) when the power demanded by the load falls below a certain level to maximize power conversion efficiency at light load. Moreover, in multi-phase converters (i.e., with multiple power stages connected in parallel) it is also desirable to change the number of operating stages according to the power demanded by the load to optimize the conversion efficiency over a very broad power range.

In addition to these measures in favor of energy efficiency, there are also protection functions that need to be considered. A typical requirement is to limit the maximum power deliverable by the converter as a protection in case of load failures.

In converters with secondary control these tasks are relatively easy to fulfil because the control IC may have direct access to the output quantities ($V_{out}$, $I_{out}$) and elaborate them to derive the power $P_{out}$ demanded by the load and take actions consequently. This case, therefore, is not interesting in this context and will not be considered any more.

In the more common case of converters with primary control, the control IC does not have direct access to the output voltage $V_{out}$ and current $I_{out}$, but can only directly read the input voltage $V_{in}$ and the input current $I_{in}$, thus assessing the input power to the converter $P_{in}$. The only information usually received from the secondary side is the control signal y.

There is one more issue to consider: as previously stated, to maximize power conversion efficiency at light load, converters are often required to work intermittently (burst-mode operation) and, during the idle periods when the converter is not switching, the input current $I_{in}$ and, then, the input power $P_{in}$ fall to essentially zero. As a result, any system computing the input power $P_{in}$ through the reading of the input voltage $V_{in}$ and the input current $I_{in}$ can provide the information to stop the converter but cannot provide the information to restart the converter. An additional functional block would be required to provide this information.

Based on these considerations, it would be convenient to use the control signal y to perform these kinds of actions because this would lead to very simple circuit implementations thanks to a signal that may be always active regardless the power circuit is operating continuously or is temporarily stopped (e.g., during burst-mode operation). Additionally, being the control signal bounded within a range, the maximum input power would be inherently limited.

The inventors have observed that, to use the control signal y as an input power gauge, there should be a one-to-one accurate relationship between the power level $P_{in}$ and the control signal y:

$$P_{in}=f(y,p_1, \ldots p_n, c_1, \ldots c_m) \qquad (1)$$

where $p_1, \ldots p_n$ is a set of parameters characterizing the power stage and $c_1, \ldots c_m$ is a set of parameters relevant to the control unit. Both $p_i$ (i=1, ... n) and $c_j$ (j=1, ... m) are assumed to be constant values subject to statistical spread.

Unfortunately a relationship like that does not exist for most of the known control methods. However, usually it is possible to find a relationship like:

$$P_{in}=f(y,V_{in},V_{out},p_1, \ldots p_n, c_1, \ldots c_m) \qquad (2)$$

This can be analyzed as follows. Generally speaking, the power level $P_{in}$ is related to the quantity $\Psi$ with a relationship such as:

$$P_{in}=g(y,\Psi,V_{in},V_{out},p_1, \ldots p_n, c_1, \ldots c_k) \qquad (3)$$

and the control signal y is related to $\Psi$ with a relationship that can be expressed as:

$$\Psi=h(y,V_{in},c_{k+1}, \ldots c_m) \qquad (4)$$

The structure and the arguments of the functions g and h depend on the topology of the power stage 22 and on the control method respectively.

As to the link between $\Psi$ and $P_{in}$, in some cases $\Psi$ is only loosely related to the power level, in other cases it is tightly related but there may be a significant dependence on $V_{in}$ and/or $V_{out}$ too.

PWM-controlled dc-dc converters operated in the Continuous Conduction Mode (CCM) using the duty-cycle control method are often an example of the first case. In fact, to a first approximation, in these systems the duty cycle depends on $V_{in}$ and $V_{out}$ only, not on $I_{out}$ (i.e., there is no $P_{in}=g(\Psi)$ function). However, in the real operation, there is often a slight dependence of the duty-cycle on the power level because the switch-on time of the power switch needs to be slightly extended to compensate for power losses (which, in turn, depend on $I_{out}$).

Resonant dc-dc converters using either the direct frequency control method or the "time-shift control" method are often another example of the first case: frequency and time-shift are a weak function of the power level; they change little with the power level and are much more affected by the input-to-output voltage ratio.

PWM-controlled dc-dc converters using the average current mode control method are often an example of the second case. In fact, with this method the quantity $\Psi$ is usually the dc input current $I_{in}$, which is strongly related to $P_{in}$; however $I_{in}$ depends on the input voltage $V_{in}$ too, so this method is effective to show $P_{in}$ if the input voltage is fixed or varying in a narrow range.

A possible exception in this panorama may be represented by PWM-controlled buck-boost or flyback converters operated at a fixed frequency in the Discontinuous Conduction Mode (DCM) using the peak current-mode control method. In this case $P_{in}$ depends mainly on the quantity $\Psi$ (the peak current $I_{pk}$):

$$P_{in}=\tfrac{1}{2}L\,I_{pk}^2 f_{SW} \qquad (5)$$

The other aspect to take into consideration is the statistical spread of the parameters $p_j$ and $c_j$. This affects both $P_{in}=g(\Psi, \ldots)$ and $\Psi=h(y, \ldots)$ and causes the quantity $\Psi$ and, then, the control signal y to spread in a certain range for a given power level from unit to unit. Accordingly, one crucial point is the sensitivity of the functions g and h with respect to the parameters $p_i$ and $c_j$. A couple of examples of how $P_{in}=g(\Psi, \ldots)$ is affected by the tolerance of $p_i$ and $c_j$ will be now given.

For example, in a resonant converter the statistical spread of the components of its resonant tank ($\in p_i$) causes the switching frequency ($\Psi$) to be different for a given $P_{in}$ and a given input-to-output voltage ratio. Additionally, the sensitivity of the switching frequency to the spread of these parameters changes considerably with the operating conditions and can go from an almost negligible to a very high level.

In the previously mentioned fixed-frequency, DCM-operated, peak-current mode controlled buck-boost or flyback converter, the statistical spread of the value L ($\in p_i$) of the inductor and the tolerance of the oscillator frequency, which the switching frequency $f_{sw}$ ($\in c_j$) is locked to, result in different values of the controlled peak current $I_{pk}$ (i.e., $\Psi$) for the same power level $P_{in}$ and, then, different values of the control signal y.

Again with reference to this converter, a parameter $\in c_j$ that adversely affects the accuracy of the $\Psi=h(y, \ldots)$ relationship is the propagation delay of the current sense comparator. Because of this delay, the controlled peak current $I_{pk}$ slightly exceeds the value programmed by the control signal y; this extra current depends on the amount of this delay and on the slope of the current, which, in turn, depends on the inductance value of the converter and the input voltage $V_{in}$. As a result, the control signal y depends on $V_{in}$ as well and not only on the input power $P_{in}$.

In this regards, A. S. Kislovski, "*A new control principle for switching regulators*", Proceedings of PCI, September 1983, Page(s) 178-186, with a review in D. Gouttenegre, B. Velaerts, T. Michaux, "*Modelling and Analysis of dc-dc Converters Control by Power Equalization*", Power Electronics Specialists Conference, 1988. PESC'88 Record, 19th Annual IEEE, Page(s) 960-967, vol. 2, proposed an "input-output power equalization" control method.

FIG. 5 shows the basic operating principle of this control method.

The dc input voltage $V_{in}$ and the instantaneous input current $I_{in}$ are measured. For example, in FIG. 5 is shown a current sensor $S1_b$ configured to measure the current $I_{in}$.

The input current $I_{in}$ is provided to a resettable integrator 248 synchronized with a clock the signal CLK that determines also the turn-on of the power switch of the power stage 22. Specifically, the signal CLK also sets a PWM latch 250, whose output Q essentially determines the duty cycle of the power switch of the power stage 22. The output $V_{int}$ of the integrator 248 will be a non-linear ramp signal that starts from zero at the beginning of each switching cycle (just after the power switch is turned on) and reaches a final value, just before being reset, that is proportional to the electrical charge taken from the power source in a switching cycle. The switching period T is assumed to be constant, thus this charge is also proportional to the average value of $I_{in}$ ($\bar{I}_{in}$) in a switching cycle, and such is the peak value of the ramp $V_{int}$ too.

The dc input voltage $V_{in}$ and $V_{int}$ are provided to the inputs of a wide-bandwidth analog multiplier/divider (MD) block 252. The wide-bandwidth requirement for MD stems from the need to follow the signal $V_{int}$ as closely as possible. The block 252 is provided with a third input $V_x$ and outputs a signal i*:

$$i^* = \frac{V_{in} \cdot V_{int}}{V_x} \quad (6)$$

The signal $V_x$ is the output of a proportional-integral-derivative (PID) regulator 254 that senses the output voltage $V_{out}$ and compares it against a reference voltage $V_{ref}$. $V_x$ can be regarded as the control signal y in the general schematic of FIG. 2.

The output of the MD block 252 goes to the non-inverting input of a comparator 256 that receives on its inverting input a signal proportional to the dc output current $I_{out}$. For example, in FIG. 5 is used for this purpose a current sensor $S2_b$ configured to measure the current $I_{out}$.

Under steady-state conditions $I_{out}$, $V_{in}$ and $V_x$ are constant, so the signal i* is a nonlinear ramp with the same shape as $V_{int}$ but with a different amplitude, adjusted by the voltages $V_{in}$ and $V_x$. When the ramp i* equals $I_{out}$ the output of the comparator 256 goes high and resets the PWM latch 250, causing the power switch of the stage 22 to turn off.

In this way, the comparator 256 maintains the equality of the output current $I_{out}$ and the peak value of i* cycle-by-cycle. Therefore:

$$\frac{V_{in} \cdot \bar{I}_{in}}{V_x} = I_{out} \quad (7)$$

Assuming lossless operation ($P_{in}=P_{out}$):

$$V_{in} \cdot \bar{I}_{in} = I_{out} \cdot V_{out} \quad (8)$$

it follows from equation (7) that:

$$V_{out}=V_x \quad (9)$$

and it is possible to state that the system in FIG. 5 maintains the output voltage $V_{out}$ at the desired level by equalizing the input and the output powers of the power stage.

This power equalizing feature brings a lot of benefits in terms of dynamic behavior because it performs a fast corrective action in case of perturbations. For example, if the input voltage is perturbed, the block 252 corrects the input power within a switching period before any deviation in the output voltage $V_{out}$ is observable. Similarly, if the output current $I_{out}$ is perturbed (e.g., due to varying load conditions) the control readjusts the input power to suit the new power demand within a switching period before the output voltage $V_{out}$ is perturbed. However, in this solution merely the driving of the power stage is adapted based on the input power, i.e., the input voltage $V_{in}$ and the input current $I_{in}$. However, the feedback control signal y indicates still only the output voltage $V_{out}$ and thus cannot be used as an input power gauge.

BRIEF SUMMARY

In view of the above, the present disclosure provides solutions where the feedback control signal is proportional to the power drawn from the input source, using a limited number of fine-tuning components.

Embodiments of the present disclosure provide an integrated control device for switching converters that is able to regulate the output voltage or the output current of the converter, or both of them using the control signal proportional to the power drawn from the input source.

According to one or more embodiments, one or more of the above is achieved by means of a power control module for an electronic converter having the features specifically set forth below. Embodiments moreover concern a related integrated circuit, electronic converter and method.

The claims are an integral part of the technical teaching of the disclosure provided herein.

As mentioned in the foregoing, an electronic converter comprising usually a power stage comprising two input terminals for receiving a first power signal and two output terminals for providing a second power signal. The converter comprises moreover a control circuit configured to control operation of the power stage as a function of a feedback control signal. For example, in various embodiments, the control circuit comprises a modulator and possibly a driver configured to generate drive signals for the power stage as a function of the feedback control signal. For example, in various embodiments, the control circuit may comprise a signal conditioning circuit configured to generate the feedback control signal as a function of the output voltage or the output current provided via the two output terminals of the converter.

In various embodiments, the feedback control signal may be proportional to the power drawn from the input source and thus may be used as input power gauge.

In various embodiments, the control circuit comprises for this reason a power control module which receives at input the feedback control signal and generates a modified control signal. For example, the power control module may be interposed between the signal conditioning circuit and the modulator. Generally, at least the power control module, the modulator and possibly the driver may be integrated in the same integrated circuit. However, the power control module may also be provided as a separate circuit.

In various embodiments, the power control module comprises a pre-elaboration module configured to generate a reference signal as a function of the feedback control signal and a first signal being representative of a voltage applied to the input terminals of the converter. For example, in various embodiments the pre-elaboration module may comprise an adder configured to apply an offset to the feedback control signal. In various embodiments, the pre-elaboration module may comprise a divider configured to compute the reference signal by dividing the feedback control signal by the first signal being representative of the voltage applied to the input terminals of the converter.

In various embodiments, the power control module comprises also an error amplifier configured to generate the modified control signal as a function of the reference signal and a second signal being representative of a current flowing through the two input terminals. For example, the error amplifier of the power control module may comprise at least an integral component. For example, such an error amplifier may be implemented with an operational amplifier and a feedback network comprising at least one capacitor.

In various embodiments, the power stage of the electronic converter may comprise a transformer including a primary and a secondary winding. In this case, the power control module may be arranged at the primary side of the transformer and the second signal may be representative of the current flowing through the primary winding of the transformer.

BRIEF DESCRIPTION OF THE SEVERAL VIEWS OF THE FIGURES

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 6 to 9 parts, elements or components which have already been described with reference to FIGS. 1 to 5 are denoted by the same references previously used in such Figures; the description of such previously described elements will not be repeated in the following in order not to overburden the present detailed description.

As mentioned in the foregoing, the present disclosure provides solutions which permit that the control signal y is proportional to the power drawn from the input source.

Figure 6:
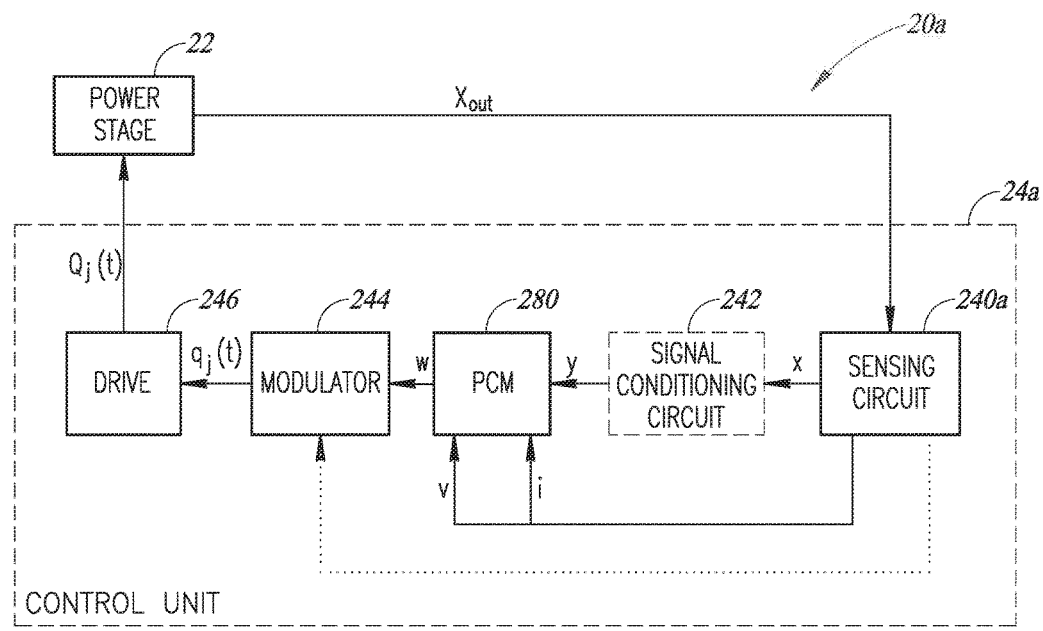
FIG. 6 shows a block diagram illustrating the typical structure of the control unit included in the power converter of FIG. 1 according to an embodiment of the present disclosure.

FIG. 6 illustrates an electronic converter 20a in accordance with one embodiment of the present disclosure.

Also in this case the electronic converter 20a comprises a power stage 22, typically a switched mode power stage, such as a boost, buck, buck-boost, flyback, forward or resonant converter, and a control unit 24a.

In the embodiment considered, the control unit 24a has a closed-loop control system. Specifically, similar to FIG. 2, the control unit 24a comprises a sensing circuit 240a, an optional signal conditioning circuit 242, a modulator 244 and a driver 246.

Also in this case, the sensing circuit 240a is configured to measure an output quantity $X_{out}$ to be regulated, e.g., either the output voltage $V_{out}$ or the output current $I_{out}$, and produces a measured value signal x being representative of $X_{out}$. In various embodiments, the sensing circuit may sense other electrical quantities in the power circuit 20 that are used to perform the control action. The measured value signal x may then be transmitted to the optional signal conditioning circuit 242. The other electrical quantities may (or may not) be transmitted to the modulator 244 either directly or properly conditioned depending on the structure of the modulator 244.

The optional signal conditioning circuit 242 may process the measured value signal x coming from the sensing circuit 240a. In particular, the signal conditioning circuit 242 receives the measured value signal x and generates a control signal y, such as a control voltage $v_C$ or a control current $i_C$, based on the measured value signal x. Generally, the signal conditioning circuit 242 is optional because the control signal y may correspond to the measured value signal x.

In the embodiment considered, the control unit 24a comprises a "Power ControlModule" (PCM) 280 inserted between the signal conditioning circuit 242 and the modulator 244. In particular, the power control module 280 receives the control signal y and generates a modified control signal w.

Accordingly, in the embodiment considered, the modulator 244 receives the modified control signal w and, in case, the additional signals produced by the sensing circuit 240a, properly conditioned if necessary. The modulator 244 modulates then a quantity Ψ, which the power stage 22 ultimately uses to control the energy flow. As the output, the modulator 244 generates a train of low-power two-level pulsed signals $q_j(t)$ that are received by the driver 246.

In various embodiments, the driver 246 may be a power amplifier and/or a level shifter that receives the low-power inputs $q_j(t)$ and produces the higher power signals $Q_j(t)$. The signals $Q_j(t)$ have an amplitude and a power level suitable to drive the power switches of the power stage 22.

Figure 1:
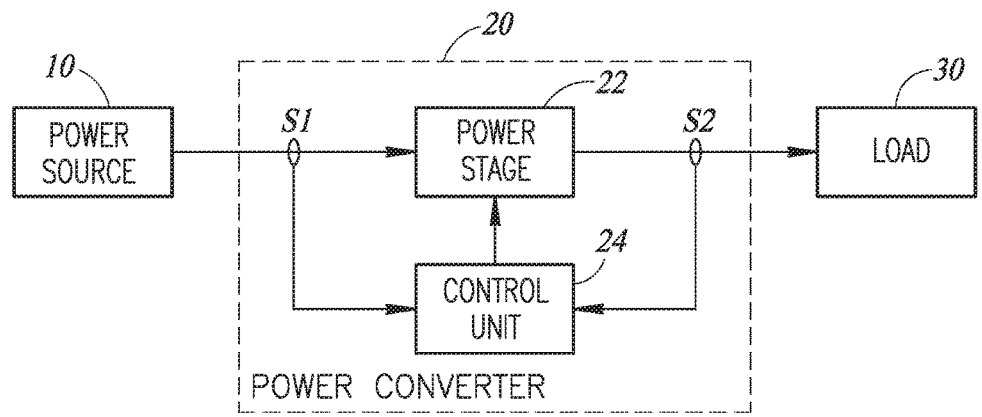
FIG. 1 shows a block diagram that illustrates the general structure of a power converter.
Figure 2:
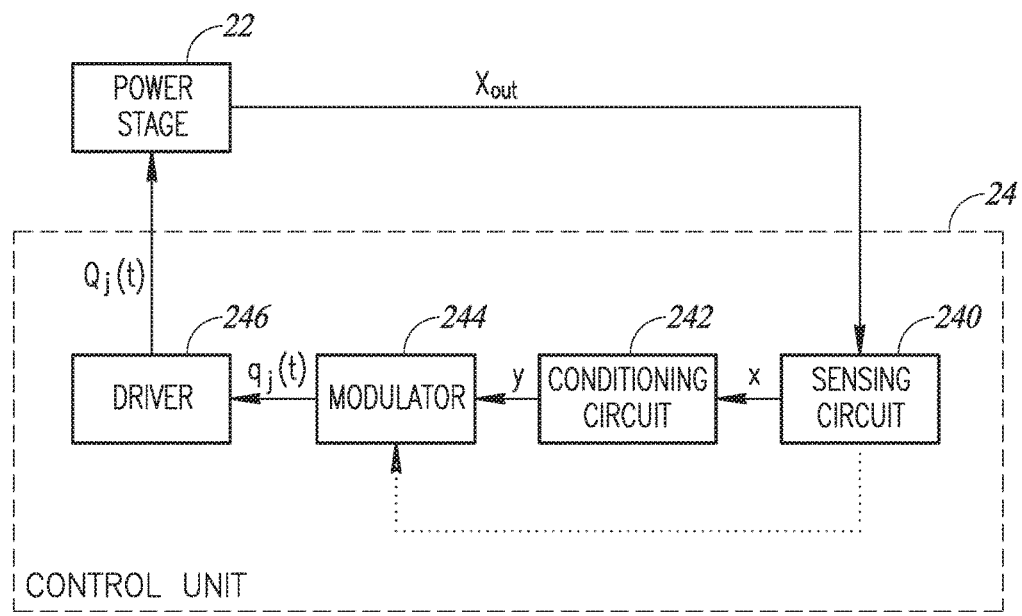
FIG. 2 shows a block diagram illustrating the typical structure of the control unit included in the power converter of FIG. 1.

Accordingly, by comparing this block diagram of FIG. 6 with the one shown in FIG. 2, it may be observed that an additional power control module 280 is inserted between the signal conditioning circuit 242 and the modulator 244. Apart from that, the general structure of the control unit 24a remains unchanged, and the related description with respect to FIG. 2 applies accordingly.

Specifically, in the embodiment considered, the module 280 receives at inputs the control signal y (which in the schematic of FIG. 2 was feeding directly the modulator 244) and two additional signals: the first signal v is representative of a voltage and a signal i being representative of a current in the power stage 20.

In various embodiments, the converter 20a is an isolated converter with primary control, i.e., the power stage 22 comprises a transformer and at least the power control module 280, the modulator 244 and the driver 246 are arranged at the primary side of the transformer. In this case, the signal conditioning circuit 242 may be used to cross the isolation barrier as shown, e.g., in FIG. 4, i.e., the control signal y will be transmitted by the signal conditioning circuit 242 located on the secondary side of the transformer thereby crossing the isolation barrier.

Accordingly, in various embodiments, the PCM 280 is located on the primary side of the power stage 22. In this case, the signal v may be representative of the dc input voltage $V_{in}$ and i of the instantaneous input current $I_{in}(t)$, such as the current flowing through the primary side.

In various embodiments, the PCM block 280 may be realized in the form of an integrated circuit, which may include also the modulator 244 and/or the driver 246.

Figure 7:
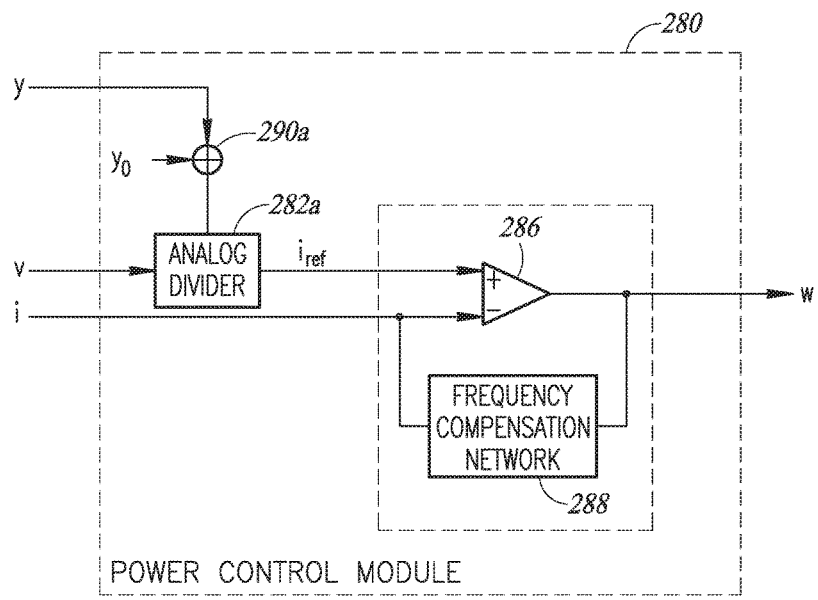
FIG. 7 shows the general structure of the Power Control Module (PCM) included in the block diagram in FIG. 6.

FIG. 7 shows in this respect a possible embodiment of the power control module 280.

In the embodiment considered, the block 280 comprises an analog divider 282a receiving the signals y, possibly offset by a value $y_0$ at an analog adder 290a, and the signal v and provides at output a reference signal $i_{ref}$.

$$i_{ref} = k_D(y - y_0)/v \quad (10)$$

where $k_D$ is an optional gain of the divider 282a.

The offsetting of y with $y_0$ is not mandatory but may be useful to let the multiplier/divider 282a handle a zero power level in real circuits by means of a signal being always larger than zero.

The signal $i_{ref}$ is fed to the non-inverting input of an integrating error amplifier 284a, whose inverting input receives the signal i. For example, in the embodiment considered, the integrating error amplifier 284a is implemented with an op-amp 286 configured as an integrating amplifier through an appropriate configuration of the frequency compensation network 288, comprising usually at least one capacitor. Accordingly, in the embodiment considered, the error amplifier comprises an integral (I) component. However, the error amplifier may also comprise further feedback components in order to implement proportional (P) and/or derivative (D) components.

In this way, under steady-state operation the average value of i, <i>, equals $i_{ref}$.

$$<i> = i_{ref} \quad (11)$$

The output of the integrating error amplifier 284a, i.e., the op-amp 286, is the second control signal w that is provided to the input of the modulator 244.

In the embodiment considered, the control signal y will be proportional to the input power $P_{in}$. Specifically, the two input signals v and i to the power control module 280 are $$v = K_v V_{in} \quad (12)$$

and $$i = K_i I_p(t) \quad (13)$$

wherein $I_p$ is the current flowing through the primary side of the transformer, and $K_v$ and $K_i$ are coefficients deriving from the sensors used to measure the values $V_{in}$ and $I_p$.

It is worth reminding that the average value of $I_p(t)$, $<I_p(t)>$, under steady-state conditions equals the dc input current $I_{in}$:

$$<I_p(t)> = I_{in} \quad (14)$$

Accordingly, in general, also other signals being indicative for the input current $I_{in}$ may be measured instead of the current $I_p$.

Thus, assuming an ideal operation of the integrating operation at block 284a and applying the virtual ground principle, the above equation (11) may be rewritten:

$$K_i \cdot I_{in} = i_{ref} \quad (15)$$

In other words the op-amp of the PCM block 280 closes an internal control loop that regulates the dc input current $I_{in}$ at a value $i_{ref}/K_i$.

The reference signal $i_{ref}$ generated by the divider block 282a may be derived from equations (10) and (12):

$$i_{ref} = k_D \frac{y - y_0}{K_v \cdot V_{in}} \quad (16)$$

Substituting equation (16) in (15) and solving for y, yields:

$$y = y_0 + \frac{K_v K_i}{k_D} V_{in} I_{in} = y_0 + \frac{K_v K_i}{k_D} P_{in} \quad (17)$$

Accordingly, in the embodiment considered, the power control module 280 connected downstream the signal conditioning circuit 242 will guarantee that the control signal y (apart from the offset $y_0$) is proportional to the input power $P_{in}$.

Those of skill in the art will appreciate that the PCM structure of FIG. 7 can be implemented also using digital blocks or a mixture of digital and analog blocks without deviating from the scope of the present disclosure.

Figure 8:
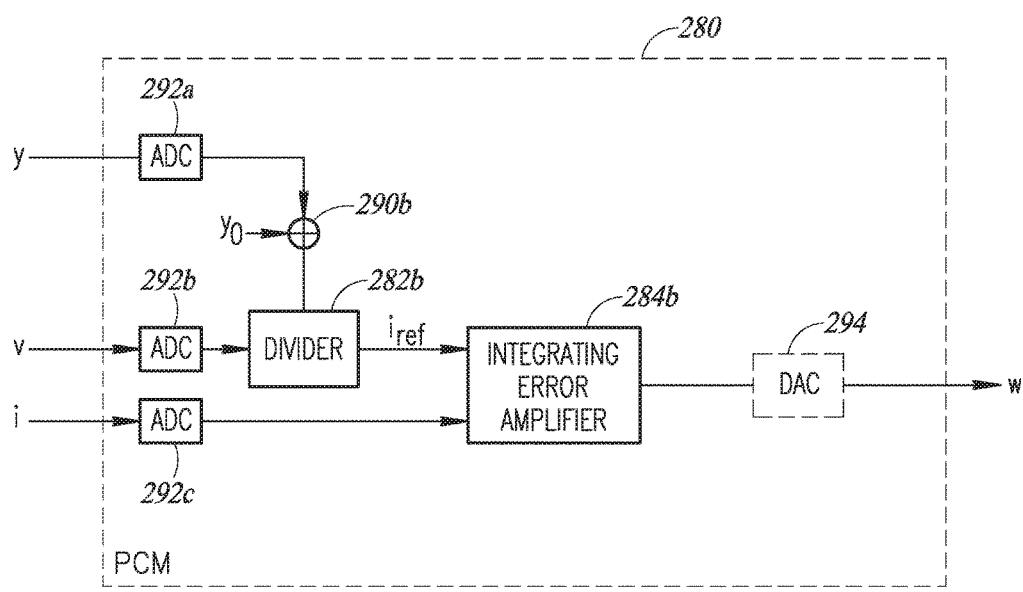
FIG. 8 shows an example of a fully digital implementation of the PCM in FIG. 7.

For example, FIG. 8 shows an embodiment of a fully digital implementation, which may be realized, e.g., by means of a software programmed micro-controller or by hardwired logic circuits.

Also in this case, the PCM block 280 comprises an optional adder 290b for adding an offset $y_0$ to the control signal y, a divider 282b receiving the control signals y (or preferably $y-y_0$), and an integrating error amplifier 284b.

In order to process the analog signals y, v and i, the PCM 280 comprises respective analog-to-digital converters 292a, 292b and 292c configured to convert these signal from analog to digital signals.

In the embodiment considered, the PCM 280 comprises moreover, a digital-to-analog converter 294 for converting the digital control signal w at the output of the integrating error amplifier 284b again into an analog signal. This converter 294 is purely optional, because the modulator 244 could also operate with digital input signal. Each of the divider 282a and adder 290a of FIG. 7 and the divider 282b and the adder 290b of FIG. 8 may collectively be considered a pre-elaboration module that generates a reference signal $i_{ref}$ as a function of a feedback control signal y and a first signal v being representative of a voltage applied to input terminals of the corresponding converter.

The PCM block 280 described herein is quite universal and can be seen as an add-on applicable to essentially all existing control loops (see, e.g., FIG. 6).

The disclosed power control module 280 has also several advantages:

1. As already discussed, in the prior art method the control variable y is proportional to the output voltage, while in the present solutions it is proportional to power.
2. The prior art method defines a control system including both the signal conditioning circuit and the modulator, whereas the present solution requires only the PCM block 280 that may be added to any existing modulator or control loop structure.
3. The input-output power equalization principle used in the prior art system is based on fixed frequency operation, whereas the present solution is applicable regardless of whether the switching frequency is constant or not.
4. The prior art method seems to be practically applicable to non-isolated converter only because it requires to combine in the control circuit dc signals coming from both the input and the output side of the converter. This task would be much more complicated in isolated converters.
5. The prior art method, being based on a resettable integrator, strives to achieve output voltage regulation by means of a cycle-by-cycle balance of the input and the output power; in the present solutions, being the integrator not necessarily resettable, output voltage regulation may be achieved by properly programming the average input current.
6. The prior art method uses a three-input wide-bandwidth multiplier performing one multiplication and one division; in the present solution a simpler two-input narrow-bandwidth divider is sufficient, because it handles slowly varying signals (v and y).

Figure 3A:
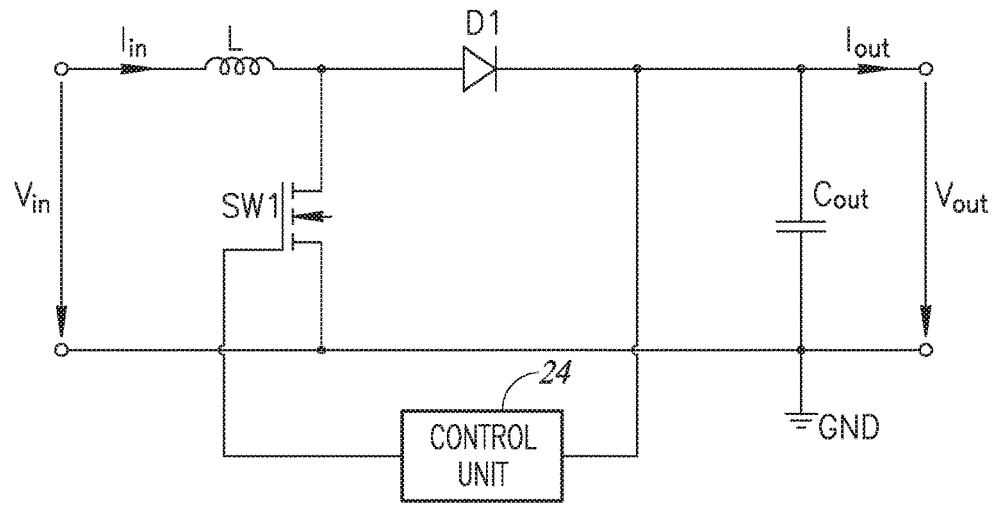
FIG. 3a shows a boost power stage, a typical non-isolated converter.
Figure 3B:
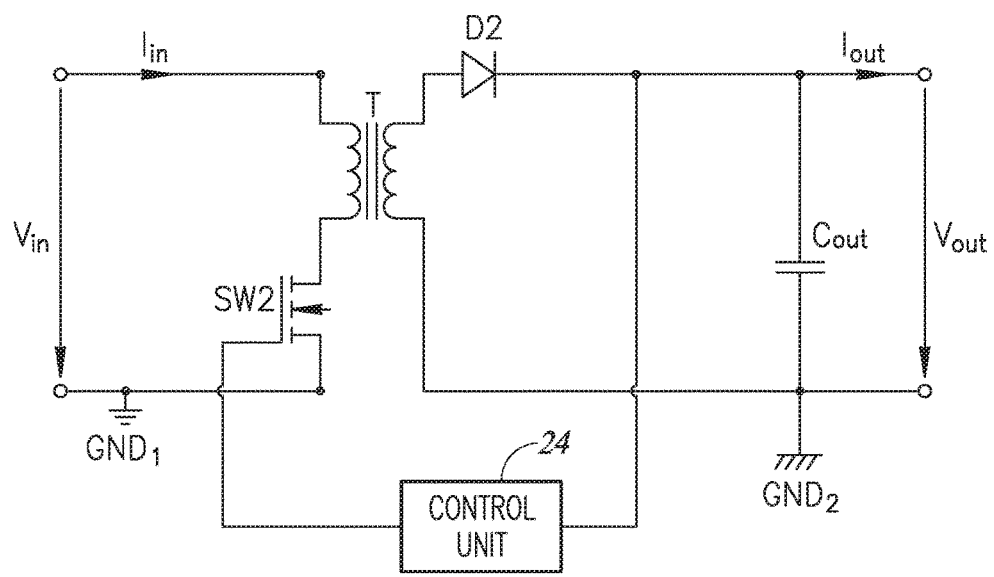
FIG. 3b shows a flyback power stage, a typical isolated converter.
Figure 4:
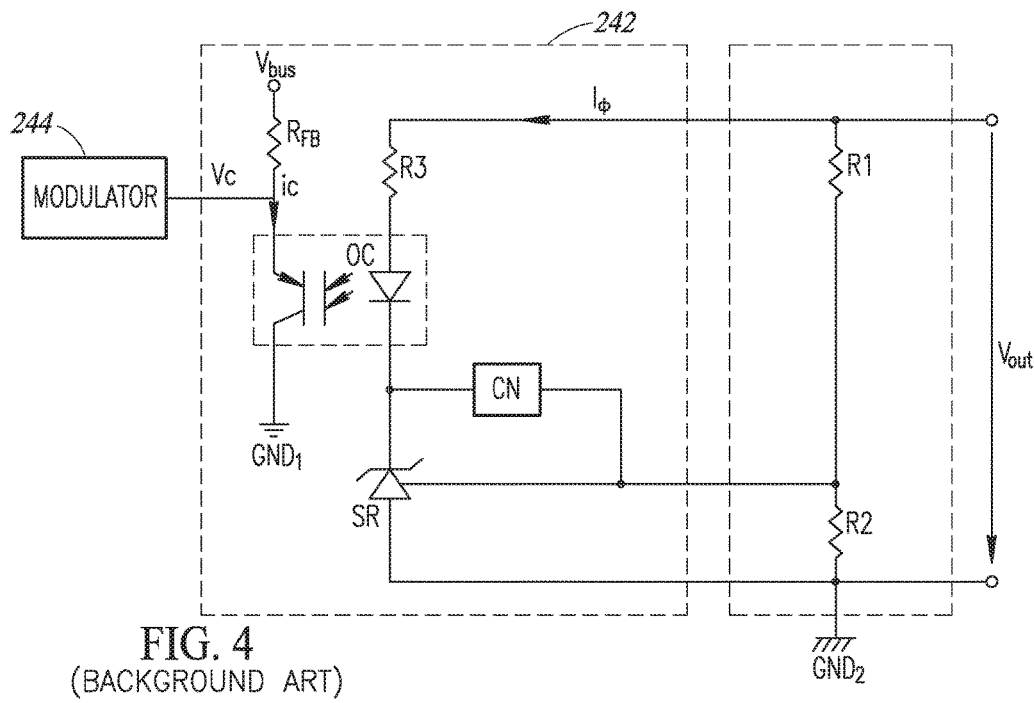
FIG. 4 shows a traditional isolated feedback network based on a shunt regulator and an optocoupler.
Figure 5:
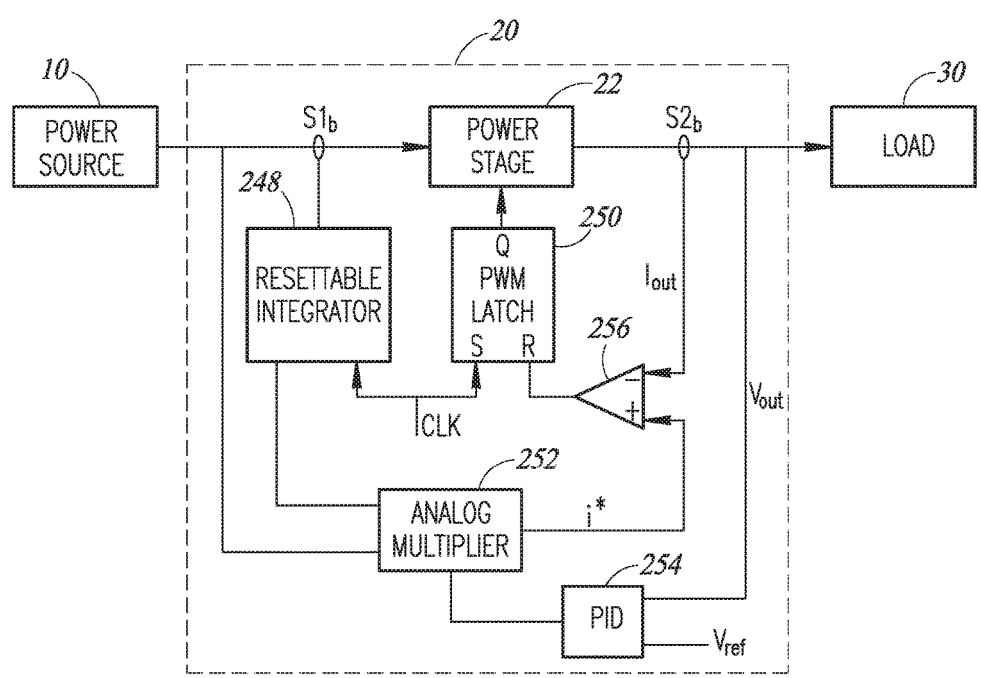
FIG. 5 shows a block diagram illustrating a prior-art power equalization control method.

As mentioned in the foregoing, the power control module 280 of the present disclosure may be applied to most switching converters with a feedback loop, such as the boost and flyback converters shown in FIGS. 3a and 3b.

Figure 9:
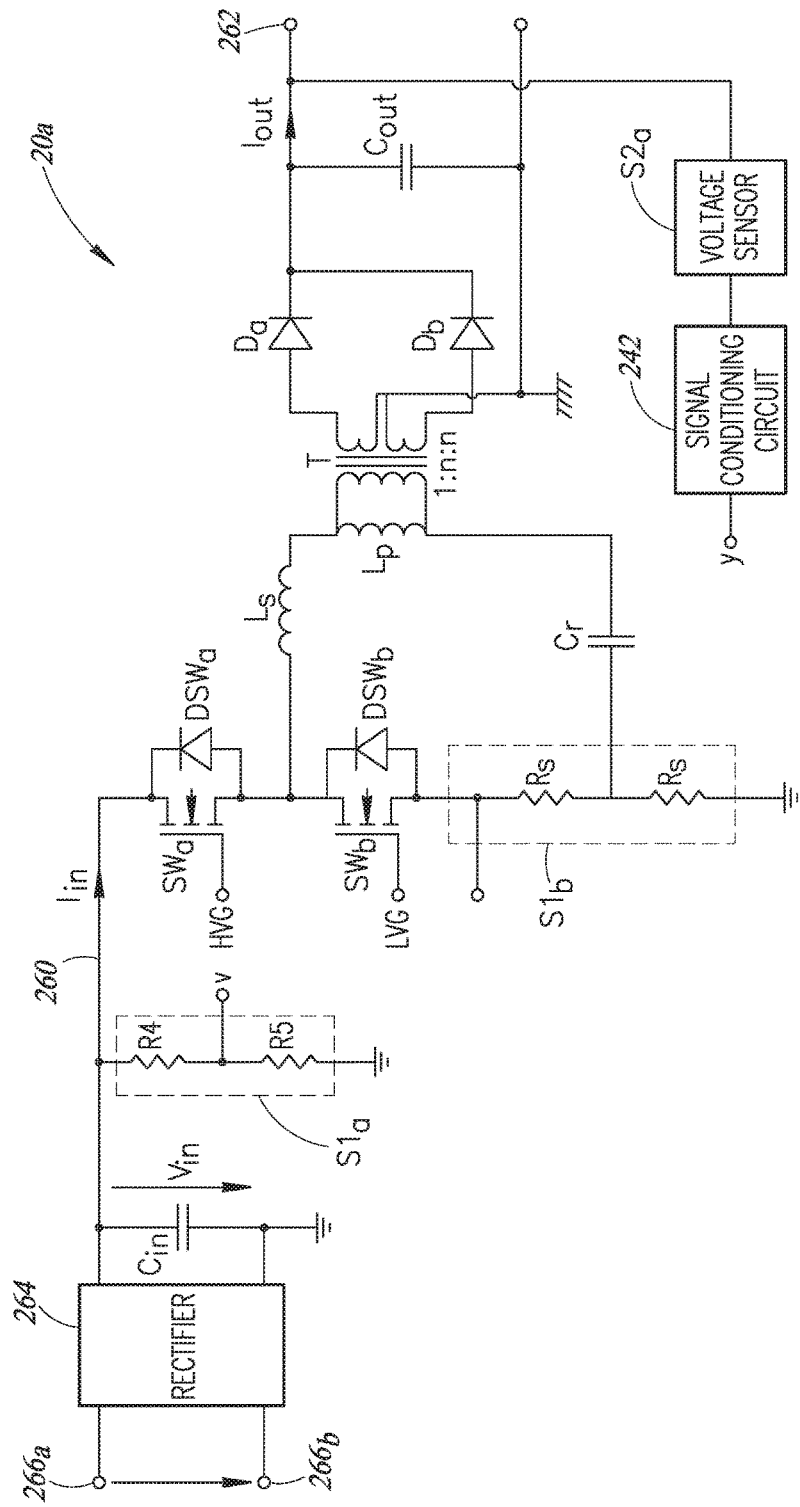
FIG. 9 shows an embodiment of an LLC resonant half-bridge converter directly supplied from the rectified power line.

FIG. 9 shows an embodiment of an LLC resonant half-bridge converter. Specifically, the converter is a so-called "wide LLC", i.e., an LLC resonant half-bridge converter directly supplied from the rectified power line, without a Power Factor Correction (PFC) pre-regulator front-end usually required to operate with all worldwide ac power sources for residential and commercial facilities (from 88 Vac to 264 Vac).

Accordingly, in the embodiment considered, the input voltage $V_{in}$ is directly obtained via a rectifier 264, such as a bridge rectifier, which rectifies an ac power supply $V_{ac}$ applied to the input terminals 266a and 266b of the converter 20a. Generally, a capacitor $C_{in}$ may also be provided at the output of the rectifier 264 to furnish a substantially dc input voltage $V_{in}$ between a line 260 and a ground $GND_1$. This voltage $V_{in}$ is applied to a power stage of the converter. Specifically, in case of an LLC resonant half-bridge converter, the power stage comprises a transformer T with a primary winding and a secondary winding.

In general, an LLC resonant converter comprises a series inductance $L_s$, i.e., an inductance connected in series with the primary winding, a parallel inductance $L_p$, i.e., an inductance connected in parallel with the primary winding, and a resonant capacitor $C_r$ connected in series with the primary winding. Often these inductances may be implemented with the leakage inductance and the magnetization inductance of the transformer T. However, the inductance $L_s$ and $L_p$ may also comprise further inductors connected in series and/or parallel with the primary and/or secondary winding of the transformer T.

For example, the transformer turn-ratio may be 17:4 (primary/secondary), the transformer leakage inductance (measured with the secondary windings shorted) may be $L_s=29$ µH and the transformer primary inductance (measured with the secondary windings open) may be $L_1=63$ µH, so that $L_p=L_1-L_s=34$ µH.

Accordingly, on the primary side, the power stage comprises a half-bridge comprising two electronic switches $SW_a$ and $SW_b$ connected in series between the voltage $V_{in}$ and the primary side ground $GND_1$, i.e., the negative terminal of the rectifier 264. Specifically, the primary winding of the transformer T is connected in series with the capacitor $C_r$ (and possibly a further inductor $L_s$) between the intermediate point of the half-bridge and the ground $GND_1$. For example, this resonant capacitor may be $C_r=2\times68$ nF.

In the embodiment considered, the power stage comprises on the secondary side a full-wave rectification arrangement. For example, in the embodiment considered, the transformer T comprises a center-tapped secondary winding (i.e., two secondary windings connected in series) and two diodes $D_a$, $D_b$. Specifically, the intermediate point (or center tap) of the secondary winding is connected to the secondary side ground $GND_2$. The anode of the diode $D_a$ is connected to a first terminal of the secondary winding and the cathode of the diode $D_a$ is connected to the positive output terminal 262. Similarly, the anode of the diode $D_b$ is connected to the second terminal of the secondary winding and the cathode of the diode $D_b$ is connected again to the positive output terminal 262. Accordingly, a positive half wave at the secondary winding will be transferred via the diode $D_a$ to the output 262/$GND_2$ (which provides the output voltage $V_{out}$ and the output current $I_{out}$) and a negative half-wave at the secondary winding will be transferred via the diode $D_b$ to the output 262/$GND_2$.

In various embodiments, the power stage comprises also an output capacitor $C_{out}$ connected in parallel with the output of the converter 262/$GND_2$. For example, the output capacitor may be $C_{out}=4\times470$ μF, with the output capacitor's equivalent series resistance (max.) $R_C=38/4$ mΩ.

In the embodiment considered, the electronic switches $SW_a$ and $SW_b$, such as power MOSFETs having associated respective body diodes $D_{SWa}$ and $D_{SWb}$, are controlled by a control circuit 28 (see FIG. 10), such as an integrated circuit, which generates respective drive signals HVG and LVG.

For example, in the embodiment considered, the control circuit 28 is configured for driving the switches $SW_a$ and $SW_b$ as a function of the output voltage $V_{out}$.

Figure 10:
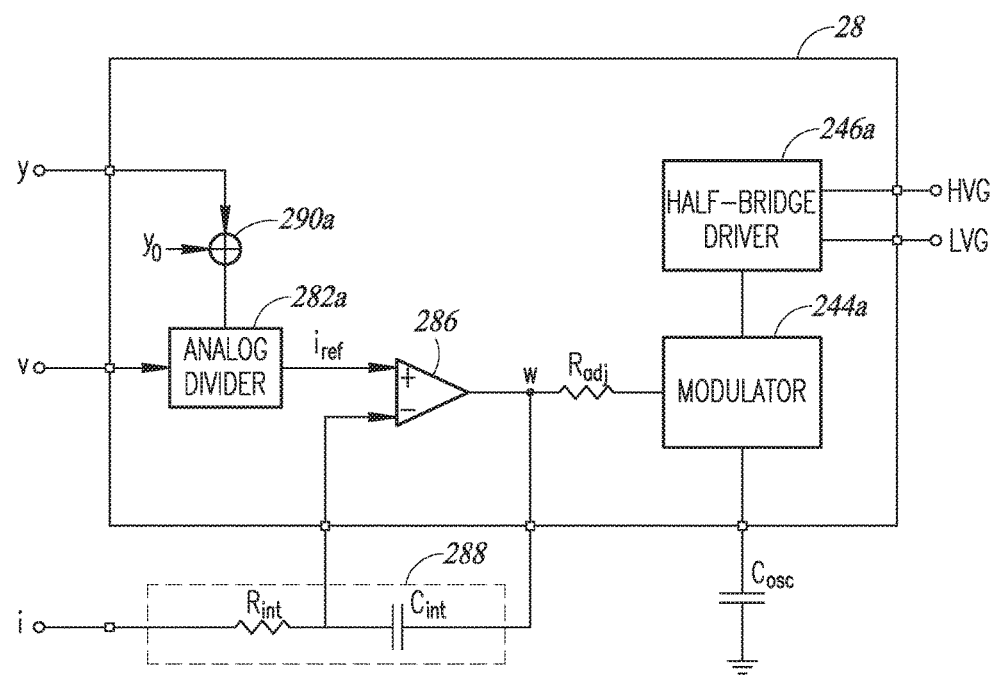
FIG. 10 shows an embodiment of a control circuit for the converter of FIG. 9.

Generally, as shown in FIG. 10, the control circuit 28 may comprise a half-bridge driver 246a configured to generate the drive signals HVG and LVG, such that the two switches $SW_a$ and $SW_b$ are switched on and off substantially in phase opposition. A small dead time may be inserted between the turn-off of either switch and the turn-on of the complementary one. This dead time ensures that the switches $SW_a$ and $SW_b$ are never cross-conducting and that they may work with soft-switching (turn-on with zero drain-to-source voltage, ZVS). As a result, the voltage applied to the intermediate point of the half-bridge will be a square-wave at a frequency $f_{SW}$, usually with 50% duty cycle, that swings substantially from 0 to $V_{in}$.

In the embodiment considered, regulation is performed by changing the frequency of this square-wave, i.e., the switching frequency of the half-bridge. For example, with increasing frequency, the transferred power will decrease.

In the embodiment considered, the control circuit 28 comprises that a modulator 244a is thus used which controls the switching frequency $f_{SW}$. For example, the modulator 244a may comprise a programmable oscillator, realized, e.g., with a capacitor $C_{OSC}$ being external to the control circuit 28. For example, this capacitor $C_{OSC}$ may be connected between a pin of the control circuit 28 and ground $GND_1$, and may be alternately charged and discharged by a current $I_{OSC}$, whose value is defined by a feedback control signal. For example, in the embodiment considered, this current is defined by the current flowing through the resistor $R_{adj}$.

This converter poses a number of challenges. Some of them, such as limiting the maximum power during overload or short circuit to a value little dependent on the input voltage, or changing the operating mode of the converter at given load levels irrespective of the input voltage to meet energy saving requirements, can be addressed by the PCM approach proposed in this disclosure.

As mentioned in the foregoing, in a conventional LLC converter circuit, the feedback control signal corresponds usually to a signal being indicative for the output voltage $V_{out}$.

Accordingly, in the embodiment shown in FIG. 9, the converter 20 comprises a voltage sensor $S2_a$ configured to measure the output voltage $V_{out}$ and a signal conditioning circuit 242 configured to transmit the measured signal from the secondary side to the primary side. A possible implementation of the output voltage sensing circuit $S2_a$ and the signal conditioning circuit 242 has already been disclosed in FIG. 4. For example, in the embodiment considered, the signal crossing the isolation barrier is the current $i_c$ of the optocoupler OC, which may be converted to a feedback voltage $v_c$ through a resistor $R_{FB}$.

For example, in the embodiment considered, the feedback signal y corresponds to the voltage feedback voltage $v_c$.

For example, the converter shown in FIG. 9 may have the following electrical specification:

| Parameter | Symbol | Value | Unit |
|---|---|---|---|
| Ac input voltage range | $V_{ac}$ | 88-264 | Vrms |
| Ac line frequency | $f_{Vac}$ | 50 | Hz |
| Dc input voltage range | $V_{in}$ | 90-375 | V |
| Regulated output voltage | $V_{out}$ | 24 | V |
| Continuous output power range | $P_{out}$ | 0-250 | W |
| Series resonance frequency | $f_{r1}$ | 80 | kHz |
| Maximum switching frequency | $f_{sw}$ | 200 | kHz |

As mentioned in the foregoing, the feedback signal y is not fed directly to the modulator 244 but to a power control module 280 which receives also signals v and i being indicative for the input voltage $V_{in}$ and the input current $I_{in}$.

For example, in the embodiment considered, the signal v is obtained through a voltage sensing circuit $S1_a$ including a voltage divider comprising two resistors R4 and R5 connected in series between the input voltage $V_{in}$ and ground $GND_1$, i.e., the signal v corresponds to a scaled down version of the voltage $V_{in}$ and the partition ratio provides the gain $K_v$.

Conversely, the signal i is obtained through a second sensing circuit $S1_b$ configured to measure a value being indicative for the input current $I_{in}$. For example, in the embodiment considered, the signal i (dimensionally a voltage) comes from an arrangement of two current sense resistors $R_s$ that enables a bidirectional reading of the tank current (i.e., the current $I_p$ flowing through the primary winding of the transformer T), both when the switch $Q_a$ is closed and when the switch $Q_b$ is closed. Accordingly, for the particular configuration, the gain $K_i$ (dimensionally a resistance) is two times the resistance value of the resistors $R_s$.

As mentioned in the foregoing, the feedback signal $V_{FB}$ (corresponding to y) and the signals v and i, which represent feed-forward signals, are fed to the power control module 280.

For example, in FIG. 10 is used the analog approach shown in FIG. 7. For example, before feeding the feedback signal $y=v_c$ to the analog divider 282a of the PCM 280, the feedback signal is offset by 1V ($=y_0$), so that under no load conditions the feedback signal will be greater than 1 V.

Moreover, in the embodiment considered, the integrating feedback network 288 of the op-amp 286 is implemented by means of a resistor $R_{INT}$ and a capacitor $C_{INT}$, which may be external to the control circuit 28.

For example the above parameters may have the following values:

| Parameter | Symbol | Value | Unit |
|---|---|---|---|
| Input current sensing gain (Current sense resistor) | $K_i = 2 Rs$ | 0.068 | $\Omega$ |
| Input voltage sensing divider ratio | $K_v$ | $2.1 \cdot 10^{-2}$ | — |
| Analog divider block gain | $K_D$ | 0.4 | V |
| Integrator resistance | $R_{INT}$ | 10 | $k\Omega$ |
| Integrator capacitance | $C_{INT}$ | 2.2 | nF |
| Voltage to current gain of integrator | $R_{adj}$ | 2 | $k\Omega$ |

The above converter has been tested under different supply and load conditions, such as full load (250 W) condition for different input voltages, in particular $V_{ac}=90$ V and $V_{ac}=264$ V:

| Parameter | Symbol | Value | Unit |
|---|---|---|---|
| Dc input voltage | $V_{in}$ | 115 | V |
| Dc input current | $I_{in}$ | 2.376 | A |
| Input power | $P_{in}$ | 271.8 | W |
| Conversion efficiency | $\eta$ | 92.1 | % |
| Min. Switching frequency | fsw | 67.7 | kHz |
| Feedback voltage | $y (v_c)$ | 2.883 | V |
| Reference voltage for integrator | $i_{ref}$ | 0.319 | V |
| Integrator output voltage | w | 1.872 | V |
| Dc input voltage | $V_{in}$ | 368 | V |
| Dc input current | $I_{in}$ | 0.737 | A |
| Input power | $P_{in}$ | 271.2 | W |
| Conversion efficiency | $\eta$ | 92.3 | % |
| Min. Switching frequency | fsw | 131.4 | kHz |
| Feedback voltage | $y (v_c)$ | 2.884 | V |
| Reference voltage for integrator | $i_{ref}$ | 0.099 | V |
| Integrator output voltage | w | 1.425 | V |

When comparing the above results, it may be appreciated that the PCM block 280 ensures that, being the input power $P_{in}$ nearly unchanged, so is the feedback signal y.

Further tests showed that the solutions disclosed herein are also robust to time varying supply voltages and/or load conditions.

Of course, without prejudice to the principles of the disclosure, the details of construction and the embodiments may vary widely with respect to what has been described and illustrated herein purely by way of example, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control circuit configured to control operation of a power stage as a function of a feedback control signal that indicates an input power provided to the power stage, and the control circuit configured to generate a digital reference signal as a function of the feedback control signal and a first signal based on an input voltage supplied to the power stage, and configured to generate a modified control signal as a function of the digital reference signal and a second signal based on an input current supplied to the power stage.

2. The control circuit of claim 1 further comprising:
a power control module configured to receive the feedback control signal and the first signal and to generate the digital reference signal; and
an error amplifier coupled to the power control module to receive digital reference signal and configured to receive the second signal and to generate the modified control signal.

3. A control circuit configured to control operation of a power stage as a function of a feedback control signal that indicates an input power provided to the power stage, and the control circuit configured to generate a digital reference signal as a function of the feedback control signal and a first signal based on an input voltage supplied to the power stage, and configured to generate a modified control signal as a function of the digital reference signal and a second signal based on an input current supplied to the power stage;
an error amplifier configured to receive a digital reference signal and the second signal and to generate the modified control signal; and
a power control module coupled to error amplifier and configured to receive the feedback control signal and the first signal and to generate the digital reference signal, the power control module including:
a first analog-to-digital digital converter configured to receive the feedback control signal and to generate a corresponding digital feedback control signal;
a second analog-to-digital converter configured to receive the first signal and to generate a corresponding digital first signal; and
a third analog-to-digital converter configured to receive the second signal and to generate a corresponding digital second signal.

4. The control circuit of claim 3, wherein the power control module further comprises a digital adder configured to apply an offset to the digital feedback control signal.

5. The control circuit of claim 4, wherein the power control module further comprises a divider configured to generate the digital reference signal by dividing digital feedback control signal by said the digital first signal.

6. The control circuit of claim 5, wherein the error amplifier comprises an integrating error amplifier configured to generate a digital modified control signal.

7. The control circuit of claim 6 further comprising a digital-to-analog converter coupled to the integrating error amplifier to receive the digital modified control signal and configured to generate the corresponding modified control signal.

8. The control circuit of claim 1 further comprising a micro-controller, and wherein the control circuit comprises software executed by the micro-controller.

9. The control circuit of claim 1, wherein the control circuit comprises hardwired digital logic circuits.

10. The control circuit of claim 1, wherein the control circuit is formed in an integrated circuit.

11. The control circuit of claim 10, wherein the integrated circuit further comprises at least one of a modulator and a driver configured to generate drive signals for the power stage as a function of the modified control signal.

12. A switching converter, comprising:
a power stage that in operation receives an input voltage signal and an input current signal and that in operation provides an output voltage signal and output current signal; and a control circuit that in operation controls the power stage as a function of a feedback control signal based on the input voltage and current signals, the feedback control signal indicating a power provided to the power stage, and the control circuit in operation generates a digital reference signal as a function of the feedback control signal and a first signal based on the input voltage, and that in operation generates a modified control signal as a function of the digital reference signal and a second signal based on the input current supplied to the power stage.

13. The switching converter of claim 12 further comprising a micro-controller, and wherein the control circuit comprises software instructions executed by the micro-controller.

14. The switching converter of claim 12, wherein the control circuit comprises hardwired digital logic circuits.

15. The switching converter of claim 12, wherein the power stage comprises a transformer including a primary winding and a secondary winding, and wherein the control circuit is coupled to the primary side of the transformer.

16. The switching converter of claim 15, wherein the primary winding receives the input current and wherein the second signal indicates the input current through the primary winding.

17. The switching converter of claim 12, wherein the control circuit in operation generates the feedback control signal as a function of the output voltage signal or the output current signal.

18. A non-transitory storage media communicably coupled to at least one processor, the non-transitory storage media storing at least one of data or processor-readable instructions that, when executed by the at least one processor, cause the at least one processor to perform the operations of:

generating a reference signal as a function of a feedback control signal that is proportional to an input power provided to a power stage and a first signal being representative of an input voltage applied to the power stage;

generating a second signal representative of an input current supplied to the power stage;

generating a modified control signal as a function of the reference signal and the second signal; and controlling operation of the power stage as a function of the modified control signal.

19. The non-transitory storage media of claim 18 further storing at least one of data or processor-readable instructions that, when executed by the at least one processor, cause the at least one processor to further perform the operation of adding an offset to the feedback control signal.

20. The non-transitory storage media of claim 18 further storing at least one of data or processor-readable instructions that, when executed by the at least one processor, cause the at least one processor to further perform the operations of:

dividing the feedback control signal adjusted by the first signal to generate the reference signal; and determining an error between the reference signal and the second signal to generate the modified control signal.

* * * * *